United States Patent
Djordjevic et al.

(10) Patent No.: US 9,722,634 B2
(45) Date of Patent: Aug. 1, 2017

(54) MULTIPLE COMPONENT CODES BASED GENERALIZED LOW-DENSITY PARITY-CHECK CODES FOR HIGH-SPEED OPTICAL TRANSPORT

(71) Applicant: NEC Laboratories America, Inc., Princeton, NJ (US)

(72) Inventors: Ivan B. Djordjevic, Tucson, AZ (US); Ting Wang, West Windsor, NJ (US)

(73) Assignee: NEC Corporation, Tokyo (JP)

( * ) Notice: Subject to any disclaimer, the term of this patent is extended or adjusted under 35 U.S.C. 154(b) by 175 days.

(21) Appl. No.: 14/513,975

(22) Filed: Oct. 14, 2014

(65) Prior Publication Data
US 2015/0106680 A1  Apr. 16, 2015

Related U.S. Application Data

(60) Provisional application No. 61/890,445, filed on Oct. 14, 2013.

(51) Int. Cl.
*H03M 13/29* (2006.01)
*H03M 13/00* (2006.01)
(Continued)

(52) U.S. Cl.
CPC ..... *H03M 13/1174* (2013.01); *H03M 13/255* (2013.01); *H04B 10/516* (2013.01); *H04L 1/00* (2013.01)

(58) Field of Classification Search
CPC ............ H04B 10/516; H03M 13/1174; H03M 13/255; H03M 13/256; H03M 13/2906;
(Continued)

(56) References Cited

U.S. PATENT DOCUMENTS 6,473,878 B1 * 10/2002 Wei ............... H03M 13/256
375/265
7,876,670 B2 * 1/2011 Li ..................... H03M 13/11
370/206
(Continued)

OTHER PUBLICATIONS

Djordjevic, et al., "Next generation FEC for high-capacity Communication in Optical Transport Networks," Journal Lightwave Technology, vol. 27, No. 16, Aug. 2009, pp. 3518-3530.
(Continued)

*Primary Examiner* — Phung M Chung
(74) *Attorney, Agent, or Firm* — Joseph Kolodka

(57) ABSTRACT

Systems and methods for data transport, including encoding streams of input data using generalized low-density parity check (GLDPC) encoders, the one or more GLDPC encoders being configured to generate GLDPC coded data streams using a plurality of component local codes to improve error correction strength, employ single-parity checks and two or more local block codes during generation of the GLDPC codes, and enable continuous tuning of code rate using the generated GLDPC codes. Signals may be generated using mappers, the mappers configured to assign bits of signals to signal constellations and to associate the bits of the signals with signal constellation points. The signal may be modulated using an I/Q or 4-D modulator composed of one polarization beam splitter, two I/Q modulators, and one polarization beam combiner. The modulated signals are multiplexed using a mode-multiplexer, transmitted over a transmission medium, and the signals are received and decoded using GLDPC decoders.

18 Claims, 4 Drawing Sheets

(51) Int. Cl.
*H03M 13/11* (2006.01)
*H04B 10/516* (2013.01)
*H03M 13/25* (2006.01)
*H04L 1/00* (2006.01)

(58) Field of Classification Search
CPC ......... H03M 13/2933; H03M 13/2948; H03M 13/152; G06F 11/10; H04L 1/006; H04L 27/186; H04L 27/3416; H04L 1/00; H04L 1/0057; H04L 27/2626; H04L 27/2647; H04L 1/0045; H04L 27/34; H04L 1/004; H04L 27/2655; H04L 27/2662; H04L 5/023; H04L 5/143; H04L 27/3483; H04L 1/0625; H04L 1/0631; H04L 27/0008; H04J 14/06
See application file for complete search history.

(56) References Cited

U.S. PATENT DOCUMENTS

| | | | | |
|---|---|---|---|---|
| 8,046,657 | B2* | 10/2011 | Johannesson | H03M 13/05 714/752 |
| 8,386,879 | B2* | 2/2013 | Djordjevic | H03M 13/1174 714/752 |
| 8,743,984 | B2* | 6/2014 | Djordjevic | H04B 10/2581 375/260 |
| 9,065,623 | B1* | 6/2015 | Chen | H04L 1/006 |
| 9,094,125 | B2* | 7/2015 | Djordjevic | H04B 10/2581 |
| 9,203,450 | B2* | 12/2015 | Beidas | H04B 7/18517 |
| 2010/0183106 | A1* | 7/2010 | Beidas | H04L 25/03038 375/350 |
| 2010/0211849 | A1* | 8/2010 | Djordjevic | H03M 13/255 714/755 |
| 2011/0085624 | A1* | 4/2011 | Djordjevic | H04B 10/532 375/341 |
| 2012/0039247 | A1* | 2/2012 | Wajcer | H04B 7/18513 370/316 |
| 2012/0263466 | A1* | 10/2012 | Djordjevic | H04L 27/2096 398/65 |
| 2013/0089326 | A1* | 4/2013 | Djordjevic | H04J 14/04 398/44 |
| 2014/0205283 | A1* | 7/2014 | Djordjevic | H04B 10/2581 398/44 |
| 2014/0219653 | A1* | 8/2014 | Djordjevic | H04J 14/06 398/44 |
| 2014/0270759 | A1* | 9/2014 | Djordjevic | H04L 1/0043 398/44 |

OTHER PUBLICATIONS

Chang, et al., "LDPC Convolutional Codes using Layered Decoding Algorithm for High Speed Coherent Optical Transmission," in Optical Fiber Communication Conference, OSA Technical Digest, Jan. 2012, pp. 1-3.

Smith, et al. "Staircase Codes: FEC for 100 Gb/s OTN," J. Lightwave Technology, vol. 30, No. 1, Jan. 2012, pp. 110-117.

Sugihara, et al., "A Spatially-coupled Type LDPC Code with an NCG of 12 dB for Optical Transmission beyond 100 Gb/s," Optical Fiber Communication Conference/National Fiber Optic Engineers Technical Digest,Oct. 2013, 3 Pages.

Djordjevic, "Advances in Error-Correction Coding for High Speed Transmission," IEEE Photonics Conference, Sep. 2013, pp. 133-134.

Djordjevic, et al., "Rate-Adaptive Irregular QC-LDPC Codes from Pairwise Balanced Designs for Ultra-High-Speed Optical Transport," CLEO, OSA Technical Digest, Jul. 2013, 2 Pages.

Djordjevic, et al., "Generalized Low-Density Parity-Check Codes for Optical Communication Systems," Journal of Lightwave Technology, vol. 23, No. 5, May 2005, pp. 1939-1946.

Djordjevic, et al., "GLDPC Codes with Reed-Muller Component Codes Suitable for Optical Communications," IEEE Communications, vol. 12, No. 9, Sep. 2008, pp. 684-686.

Tanner, "A Recursive Approach to Low Complexity Codes," IEEE Transactions of Information Theory, vol. IT-27, No. 5 Sep. 1981, pp. 533-547.

Boutros, et al., "Generalized Low Density (Tanner) Codes," IEEE International Conference Communication, Mar. 1999, pp. 441-445.

Lentmaier, et al., "On Generalized Low-Density Parity-Check Codes Based on Hamming Component Codes," IEEE Communication, vol. 3, No. 8 Aug. 1999, pp. 248-250.

Ashikhmin, et al., "Simple MAP Decoding of First-Order Reed-Muller and Hamming Codes," IEEE Transactions on Information Theory, vol. 50, No. 8, Aug. 2004, pp. 1812-1818.

* cited by examiner

MULTIPLE COMPONENT CODES BASED GENERALIZED LOW-DENSITY PARITY-CHECK CODES FOR HIGH-SPEED OPTICAL TRANSPORT

RELATED APPLICATION INFORMATION

This application claims priority to provisional application Ser. No. 61/890,445 filed on Oct. 14, 2013, incorporated herein by reference.

BACKGROUND

Technical Field

The present invention relates to coded modulation, and more particularly, to generalized low-density parity-check (GLDPC) codes derived from multiple component codes suitable for ultra-high-speed serial optical transport networks.

Description of the Related Art

The 40/100 Gigabit Ethernet standard (e.g., IEEE 802.3ba) has recently been ratified, but there exists ever-increasing capacity demands (e.g., future Terabit per second Ethernet, TbE). As the operating symbol rates increase, the deteriorating effects of fiber nonlinearities and polarization-mode dispersion (PMD) reach levels that inhibit reliable communication over the optical fiber network. Thus solutions for 100 GbE and beyond need to attain ultra-high transmission speeds in terms of aggregate bit rates while keeping the operating symbol rates low to facilitate nonlinearity and polarization mode dispersion (PMD) management. This in return requires the use of modulation formats with high spectral efficiencies (SE).

However, as a signal constellation grows in size to increase its SE, so does the optical signal-to-noise ratio (OSNR) it requires to achieve a certain bit error ratio (BER) and this might jeopardize its use in practice, but when used in combination with strong forward error correction (FEC) codes, the OSNR requirement of the systems employing such high-SE modulation formats can be significantly lowered. Thus, methods that can combine modulation and coding (e.g., coded modulation methods), are useful in the design and implementation of high-speed optical communication systems. Furthermore, in the context of high-speed optical communication systems, not only the error correction performance but also the complexity of a coded modulation system plays a crucial role.

A key enabling technology for the next generation of optical transport is a soft-decision forward error correction (FEC). It has been shown that LDPC coded modulation based on large girth (e.g., ≥10) LDPC codes provide excellent bit error rate (BER) performance, but the codeword lengths are excessively long for quasi-cyclic (QC) LDPC code design, and corresponding decoders are difficult to implement with existing hardware, and girth-8 LDPC codes exhibit the error floor phenomenon. To eliminate the error floor phenomenon, an outer BCH/RS code has been traditionally used. By using this approach the error floor of girth-8 and girth-6 LDPC codes can be eliminated. However, the corresponding net coding gains (NCGs) are much below that of large-girth LDPC codes.

SUMMARY

A method for data transport, including encoding one or more streams of input data using one or more generalized low-density parity check (GLDPC) encoders, the one or more GLDPC encoders being configured to generate GLDPC coded streams using a plurality of component local codes to increase error correction strength; employ single-parity checks and two or more local block codes during generation of the GLDPC codes; and enable continuous tuning of code rate using the generated GLDPC codes; generating one or more signals using one or more mappers, the mappers configured to assign bits of one or more signals to one or more signal constellations and to associate the bits of the one or more signals with one or more signal constellation points; modulating the signal from mapper using either I/Q or 4-D modulator composed of one polarization beam splitter, two I/Q modulators, and one polarization beam combiner; multiplexing modulated signals by using mode-multiplexer; and transmitting the signals over a transmission medium.

A system for transmitting data, including one or more generalized low-density parity check (GLDPC) encoders configured to encode one or more streams of input data, the one or more GLDPC encoders being further configured to generate GLDPC coded streams using a plurality of component local codes to increase error correction strength; employ single-parity checks and two or more local block codes during generation of the GLDPC codes; and enable continuous tuning of code rate using the generated GLDPC codes; one or more mappers configured to generate one or more signals, the mappers being further configured to assign bits of one or more signals to one or more signal constellations and to associate the bits of the one or more signals with one or more signal constellation points; one or more I/Q or 4-D modulators configured to modulate the signal from the mappers using either one polarization beam splitter, two I/Q modulators, or one polarization beam combiner; one or more mode-multiplexers configured to multiplex modulated signals; and a transmission medium configured to transmit the signals.

A system for receiving data, including one or more receivers configured to receive transmitted signals; one or more demultiplexers, polarization diversity coherent detection of the received transmitted signals, and demodulators/demappers configured to demultiplex, demodulate/demap, and perform; and one or more generalized low-density parity-check (GLDPC) decoders configured to decode the received signals, the one or more GLDPC decoders being further configured to perform a plurality of iterations of decoding, and to halt decoding when a valid codeword has been obtained or a predetermined number of iterations is reached.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
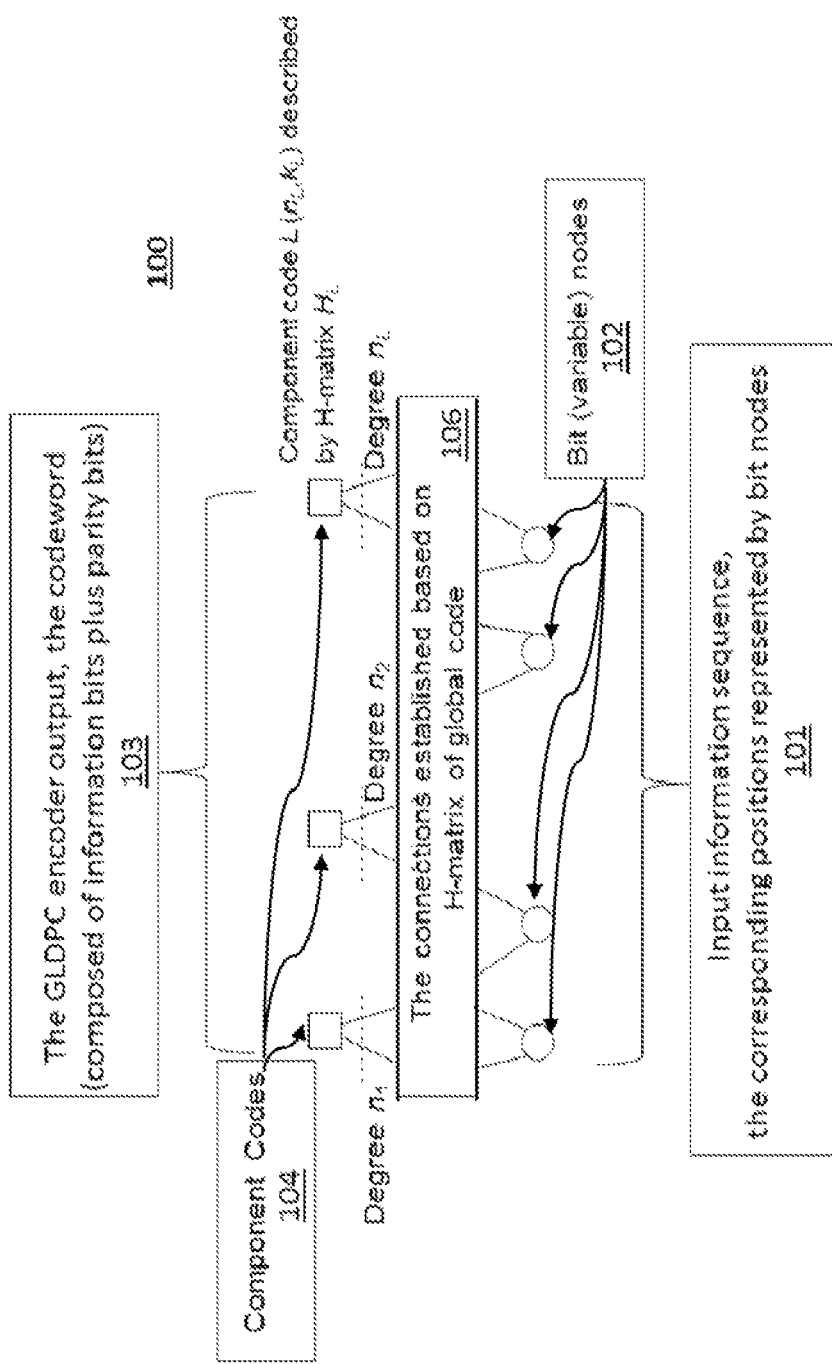
FIG. 1 is a block/flow diagram illustrating a system/method for data transport that employs generalized low-density parity-check (GLDPC) codes derived from multiple component codes in accordance with the present principles.

In accordance with the present principles, systems and methods are provided to enable ultra-high speed serial optical transport that may employ commercially available equipment operating at lower speed by employing generalized low-density parity-check (GLDPC) codes derived from multiple component codes. It is noted that GLDPC coding represents an excellent candidate for ultra-high-speed optical transport due its low decoding complexity and good error performance, in particular for column-weight-3 global codes. However, GLDPC codes based on column-weight-3 LDPC codes exhibit low code rates to be of practical importance for ultra-high-speed optical transport. As a compromising solution, conventional GLDPC codes based on column-weight-2 global codes have been studied for use in optical communication. However, this class of GDLPC codes, although of low decoding complexity, has inferior performance compared to corresponding LDPC counterparts.

Conventional systems have employed single block-code as a local (e.g., constituent) code in GLDPC coding. However, to improve error correction strength of GLDPC coding, the present principles may employ multiple component local codes (e.g. Hamming, Bose, Chaudhuri, and Hocquenghem (BCH), Reed-Muller (RM) codes, etc.), instead of a single local code. Furthermore, to solve for low code rate problem, the present principles may employ a class of GLPDC codes composed of single-parity checks and several local block codes.

The maximum a posteriori probability (MAP) decoding of a single-parity check code may be trivial, while the overall complexity of MAP decoder of RM codes (e.g., based on fast Walsh-Hadamard transform) may be of order n log n, where n is the codeword length of RM code. Record coding gains may be obtained from properly designed GLDPC codes, derived from multiple component codes, according to the present principles.

Before discussing the present principles in detail, it is noted that several recently proposed classes of LDPC codes (e.g., convolutional, staircase, and spatially-coupled codes) may be described using the concept of GLDPC coding, and as such, the GLDPC coding according to the present principles may be used as a unified platform for advanced FEC enabling ultra-high speed optical transport. The present principles may employ GLDPC codes based on multiple component (local) codes. For example, let the parity-check matrices of the l-th local code be denoted by $H_l$ (l=1, ..., L; L-the number of local codes), and let the parity-check matrix of global code be denoted by $H_G$. The following $H_G$-matrix may lead to the generalization of both Tanner and Boutros codes, and may be given as follows:

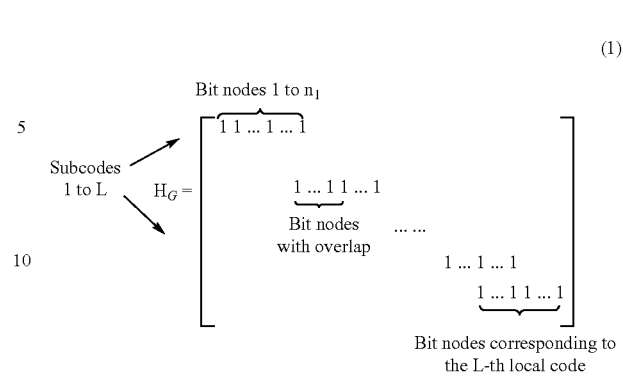

Next, the bit nodes in (1) corresponding to the l-th local code (l=1, ..., L) may be replaced by parity-check matrix of $(n_1,k_l)$ local code $H_l$, wherein such a matrix may be denoted by $H_B$. In one embodiment, there may be overlap between neighboring two rows in global code, which may be different for different neighboring row-pairs. Such obtained code may be categorized as a staircase-like LDPC code, providing that local codes are LDPC subcodes. By instead employing Hamming, BCH, and RM codes as local codes, a much stronger GLDPC code can be obtained. The parity-check matrix of GLDPC code may be obtained as follows:

$$H = [H_B^T \pi_j(H_B)^T \ldots \pi_{W-1}(H_B)^T], \quad (2)$$

where $\pi_j$ (j=1, ..., W-1) may denote the random-column permutation of $H_B$ (T denotes the transposition operation). The decoding of this GLDPC code can be performed in a conventional manner, and other classes of recently proposed LDPC codes (e.g., convolutional and spatially-coupled) may also be illustrated in a similar fashion.

In one embodiment, to obtain various classes of LDPC codes, the template parity-check matrix of quasi-cyclic LDPC codes may be employed, and may be defined as:

$$H = \begin{bmatrix} I & I & I & \ldots & I \\ I & P^{S[1]} & P^{S[2]} & \ldots & P^{S[c-1]} \\ I & P^{2S[1]} & P^{2S[2]} & \ldots & P^{2S[c-1]} \\ \ldots & \ldots & \ldots & \ldots & \ldots \\ I & P^{(r-1)S[1]} & P^{(r-1)S[2]} & \ldots & P^{(r-1)S[c-1]} \end{bmatrix}, \quad (3)$$

where I may be a B×B (B is a prime number) identity matrix, P may be a B×B permutation matrix given by $P=(p_{ij})_{B \times B}$, $p_{i,j+1}=p_{B,1}=1$ (zero otherwise), and where r and c represent the number of block-rows and block-columns, respectively. The powers of permutation matrices denoted as S[i]; i=0, 1, ..., c-1; may be chosen appropriately (e.g., so that cycles of short length (in particular 4 and 6) are avoided.

In one embodiment, the template H-matrix of (column-weight-3, row-weight-5) regular QC code may be given as:

$$H_t = \begin{bmatrix} I & I & I & I & I \\ I & P^{S[1]} & P^{S[2]} & P^{S[3]} & P^{S[4]} \\ I & P^{2S[1]} & P^{2S[2]} & P^{2S[3]} & P^{2S[4]} \end{bmatrix}, \quad (4)$$

where the global code may be an identity matrix. By interpreting the portions of this template matrix as local codes, a GDLPC code may be created as follows:

$$H = \begin{bmatrix} I & & & & & & & \\ P^{s[1]} & P^{s[2]} & & & & & & \\ P^{2s[1]} & P^{2s[2]} & P^{2s[3]} & & & & & \\ I & I & I & & & & & \\ & & & P^{s[3]} & P^{s[1]} & P^{s[2]} & & \\ & & & & P^{2s[1]} & P^{2s[2]} & P^{2s[3]} & \\ & & & & & I & I & \\ & & & & & & P^{s[3]} & \\ & & & & & & & \ddots \end{bmatrix}, \quad (5)$$

which may be the convolutional LDPC code of period 4 (e.g., indicating that a convolutional code is periodic).

In one embodiment, if the global codes are let to be an all-one column vector, interpreting the portions of the template matrix as local codes, a GLDPC code may be created as follows:

$$H = \begin{bmatrix} I & I & & & \\ P^{s[1]} & P^{s[2]} & I & I & \\ P^{2s[1]} & P^{2s[2]} & P^{s[3]} & P^{s[4]} & \\ & & P^{2s[3]} & P^{2s[4]} & \end{bmatrix}, \quad (6)$$

which may be a spatially-coupled LDPC code. The staircase-LDPC codes may be designed in a similar fashion as follows:

$$H = \begin{bmatrix} I & I & I & I & & & \\ & I & P^{s[1]} & P^{s[2]} & P^{s[3]} & & \\ & & I & P^{2s[1]} & P^{2s[2]} & P^{2s[3]} & \end{bmatrix}. \quad (7)$$

It is noted that the design of spatially coupled LDPC code and staircase-LDPC codes from the same template-quasi cyclic (QC) LDPC code is not the unique one. In one embodiment, the decoding can now be performed in GLDPC fashion by, for example, interpreting the block-rows as the local codes and applying soft-input soft-output (SISO) decoding. Multiple SISO decoders may operate in parallel, and once SISO decoding is complete, the corresponding log-likelihood ratios (LLRs) may be passed to global code perform either a message passing method (common for LDPC codes), or MAP decoding, depending on the complexity of the global code. Thus, the GLDPC codes derived by (2) are inferior to the class of GLDPC codes by Lentmaier and Zigangirov (LZ-codes). For simplicity of illustration, only LZ GLDPC codes will be discussed below according to the present principles, and the LZ-codes discussed may be derived from multiple component codes, although it is noted that any other codes may also be employed according to the present principles.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring now to FIG. 1, a system for data transport employing multiple component code based generalized low-density parity-check (GLDPC) codes 100 to improve error correction (e.g., forward error correction (FEC)) is illustratively depicted according to one embodiment of the present principles. In one embodiment, the system 100 includes L component (local) codes 104 (represented by square) and k information bits are represented by circle 102. The l-th (l=1, 2, ... , L) component code ($n_l$, $k_l$) is represented by the parity-check matrix $H_l$. The connections among variable nodes (102) and component code nodes (104) are established based on parity-check matrix of global LDPC code $H_G$, represented by block 106. The l-th row of $H_G$ corresponds to the l-th component code. The nonzero locations indicate which bit nodes values to pass to the l-th code for further encoding. The encoding of local codes is performed iteratively in order (l=1, 2, . . . , L), since a given bit node can be involved in several component codes. After GLDPC encoding, the codeword is passed to multidimensional coded-modulator, followed by multidimensional electro-optical modulator, and transmitted over a transmission medium (e.g., single-mode fiber, or spatial division multiplexing (SDM) fiber (e.g., few-mode fiber (FMF), few-core fiber (FCF), or few-mode-few-core fiber (FMFCF)).

Figure 2:
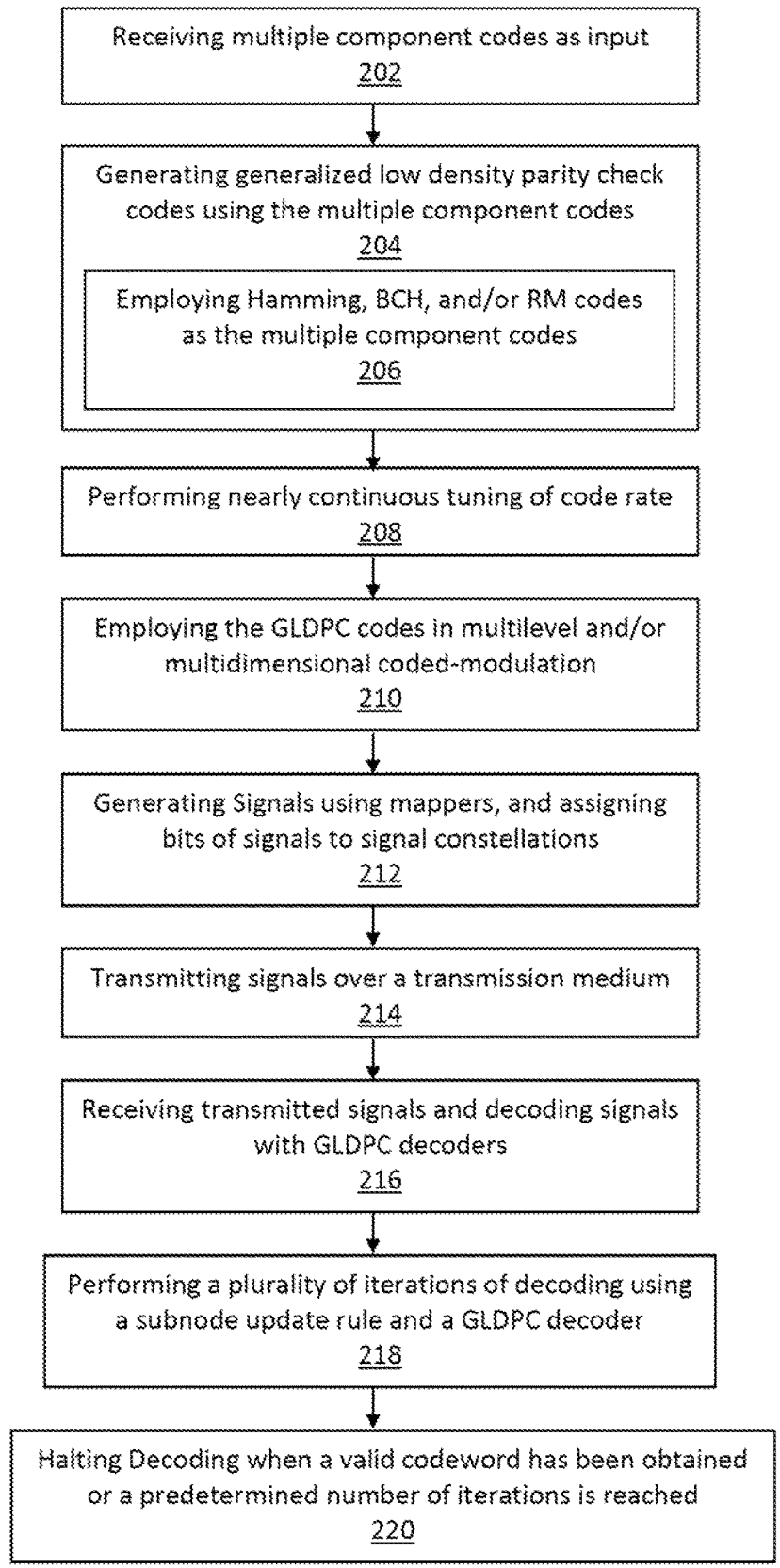
FIG. 2 is a block/flow diagram illustrating a system/method for data transport that employs generalized low-density parity-check (GLDPC) codes derived from multiple component codes in accordance with the present principles.

Referring now to FIG. 2, a system/method for data transport employing multiple component code based generalized low-density parity-check (GLDPC) codes to improve error correction (e.g., forward error correction (FEC)) is illustratively depicted according to one embodiment of the present principles. It is noted that LZ-codes (e.g., a class of GLDPC codes) may be generated starting from global LDPC codes by replacing every row of a global LDPC code by a parity-check matrix of a single local code.

However, in one embodiment, a different method is employed according to the present principles. In this embodiment, to improve the error correction strength of GLDPC coding, multiple component local codes are received as input in block 202, and GLDPC codes are generated using the multiple component codes in block 204. The i-th row of a global code may be replaced by the parity-check matrix of the i-th local (component) code $H_i$ according to the present principles. It is noted that a global code may include a plurality of rows, and therefore, many multiple codes may be defined, and if the number of rows in a global code is larger than the number of available local codes, the repetition of certain local codes is unavoidable. It is further noted that the row-weight of the i-th row in global code may be equal to the codeword length of employed local code $n_i$, and that the global LDPC code could be either a regular or an irregular LDPC code.

In one embodiment, for ultra-high-speed applications (e.g., beyond 100 Gb/s serial optical transport), the use of global LDPC codes of row-weight larger than 2 leads to unacceptably low overall code rates of GLDPC codes. This is one reason why regular (or irregular) LZ codes based on global codes of column-weight of ≤2 are advantageously employed according to the present principles. In one embodiment, by employing the present principles to improve the code rate, some of local codes could be simple parity-check equations, whose MAP decoding complexity is trivial. For instance, if only single-parity check codes and (n,k) local code are used in regular GLDPC code design, the corresponding code rate R can be bounded as follows:

$$1 - \frac{W}{n} - \frac{W}{d}\left(1 - \frac{k+1}{n}\right) \leq R \leq R_G, \quad (8)$$

where W is the column-weight of the global regular code, and parameter d denotes that the every d-th row in a global code is replaced by (n,k) local code, while the remaining rows from the global code may be interpreted as single-parity-check codes in GLDPC code. In (8), $R_G$ denotes the code rate of global regular code, which may be $R_G=1-W/n$. This GLDPC code design is quite suitable for code-rate adaptation, and an effectively continuous tuning of code rate is possible by varying the parameter d.

In one embodiment, the complexity of decoding of GLDPC codes, when all parity-check equations in the parity-check matrix of the global code are substituted with local codes, is of the order $(N/n)\Sigma_i\, n_i \log\, n_i$, where N is the codeword length of the global code, n is the average row-weight of the global code, and $n_i$ is the row-weight of the i-th row. On the other hand, the decoding complexity of GLDPC code with code rate satisfying (8) is of the order $(N/d)\, \Sigma_i\, n_i\, \log\, n_i+(N-N/d)\times 3$, where the second term corresponds to the complexity of the parity-check equations. The complexity of the single parity-check is three additions per local variable node. Since the complexity of a sum-product algorithm (typically used in decoding of LDPC codes) is dominated by the check-node update rule, the complexity of the sum-product algorithm (per iteration) will be of the order $(N-K)w_r$, where (N,K) are parameters of resulting GLDPC code, and $w_r$ is the average row-weight of the global code parity-check matrix. Given the fact that resulting GLDPC code is of girth-4 and has huge column-weight it does not make sense at all to use the sum-product algorithm in decoding of resulting GLDPC code, since strictly speaking the resulting GLDPC code is not a low-density one. Instead, the comparison can be made with respect to a reasonable complexity LDPC ($N_{LDPC}$, $K_{LDPC}$) code of large (high) girth.

The complexity of the GLDPC codes according to one embodiment of the present principles, with multiple RM component codes (when the complexity of the parity-check equations can be ignored) may be, therefore, $(N_{LDPC}-K_{LDPC})w_r/[(N/d)\, \Sigma_i n_i\, \log_2\, n_i]$ times lower than that of a competitive LDPC ($N_{LDPC}$, $K_{LDPC}$) code of row-weight $w_r$. When single-parity-checks dominate over other local codes, the complexity of parity-check codes must be taken into account. Given that the complexity of variable-nodes update rule in an LDPC code is given by $N_{LDPC}w_c$, where we is the column-weight of the parity-check matrix of LDPC code, while the complexity of variables LLRs' update is $N_{LDPC}(w_c+1)$, the complexity ratio (CR) of LDPC decoder complexity over GLDPC decoder complexity [satisfying the inequalities (1)] can be defined as:

$$CR = \frac{(N_{LDPC}-K_{LDPC})w_r + N_{LDPC}(2w_c+1)}{(N/d)\sum_i n_i \log_2 n_i + (N-N/d)\times 3} \times \frac{t_{LDPC}}{t_{GLDPC}}, \quad (9)$$

where $t_{LDPC}$ and $t_{GLDPC}$ denote the number of iterations in LDPC and GLDPC codes, respectively.

In one embodiment, Hamming, BCH, and/or RM codes may be employed as multiple component codes in block 206, and single-parity checks and one or more block codes may be included in the class of GLDPC codes, and as MAP decoding of single parity-checks may be trivial, while the overall complexity of MAP decoder for RM code based on FWHT may be of order n log n, this class of GLDPC codes may be employed effectively for ultra-high-speed implementation at least because of its low complexity level as compared to conventional LDPC counterparts. A continuous, or nearly continuous tuning of code rate may be performed in block 208, and the GLDPC codes generated according to the present principles may be employed in both multilevel and multidimensional coded-modulations in block 210.

In one embodiment, signals may be generated using one or more mappers, and bits of signals may be assigned to one or more signal constellations in block 212. Signals may be transmitted over a transmission medium (e.g., FMF) in block 214, and the transmitted signals may be received by a receiver and decoded using one or more GLDPC decoders in block 216. A plurality of iterations of decoding using a subnode update rule and a specialized low-complexity GLDPC decoder (e.g., Ashikhmin-Lytsin Decoder) may be performed in block 218, and decoding may halt when a valid codeword has been obtained or when a predetermined (e.g., maximum) number of iterations has been reached in block 220.

The decoding principle of the GDLPC codes according to the present principles can be described as follows. Let $x=(x_v)_{b \leq v \leq s}$ be a codeword, and let $H_G=(h_{s,v})_{b \times n}$, be the parity-check matrix of a global code (with b and n representing the dimensions of $H_G$). Each row s of this matrix represents a subcode node and every column v a variable (bit) node in corresponding bipartite graph. An edge connecting vertices s and v exists if $h_{s,v}=1$, i.e. if variable v has been involved in subcode s. The parity-check matrices of local codes denoted by $H_s(s=1, \ldots, S)$. Obviously, the subcode node s degree must be identical to the number of columns in local code $H_s$. The positions of ones in the s-the row of $H_G$ determine the variables passed to the local decoder $H_s$. The decoding method for LZ-codes with multiple component codes can be summarized as follows.

Initialization step. The prior information of the bit at position v, $\mu_v^{(0)}$, is determined as $$\mu_v^{(0)} = \log\left[\log\left(\frac{Pr(v=0|y_v)}{Pr(v=1|y_v)}\right)\right], \quad (10)$$

with $y_v$ is the sample that corresponds to $x_v$. The messages passed from variable node v to subcode node s in the bipartite graph, $\lambda_{v,s}^{(0)}$, are initialized to $\mu_v^{(0)}$.

Suhnode update rule. In the i-th iteration, the messages to be passed from subcode node s to bit node v, $\Lambda_{s,v}^{(i)}$, are obtained as the outputs of corresponding specialized low-complexity GLDPC decoder (e.g., Ashikhmin-Lytsin decoder), operating on the local codes described by the parity-check matrices $H_s$ (s=1, ..., S).

Variable node update rule. Messages to be passed from bit node v to subcode node s, $\lambda_{v,s}^{(i)}$, are updated according to:

$$\lambda_{v,s}^{(i)} = \mu_v^{(0)} + \sum_{s' \neq s} \Lambda_{s',v}^{(i)}. \quad (11)$$

Bit decisions. The last step in the j-th iteration is to compute updated LLRs $\mu_v^{(j)}$ according to:

$$\mu_v^{(j)} = \mu_v^{(0)} + \Sigma_x \Lambda_{x,v}^{(j)}. \quad (12)$$

For each bit $x_v$ the estimation is made according to $$\hat{x}_v = \begin{cases} 1, & \text{if } \mu_v^{(j)} < 0 \\ 0, & \text{otherwise} \end{cases}. \quad (13)$$

Decoding may halt when a valid codeword has been obtained or a predetermined maximum number of iteration has been reached.

It is noted that while the above configuration and GLDPC codes are illustratively depicted according to embodiments of the present principles, other sorts of configurations and GLDPC codes are contemplated, and may be employed according to the present principles.

Figure 3:
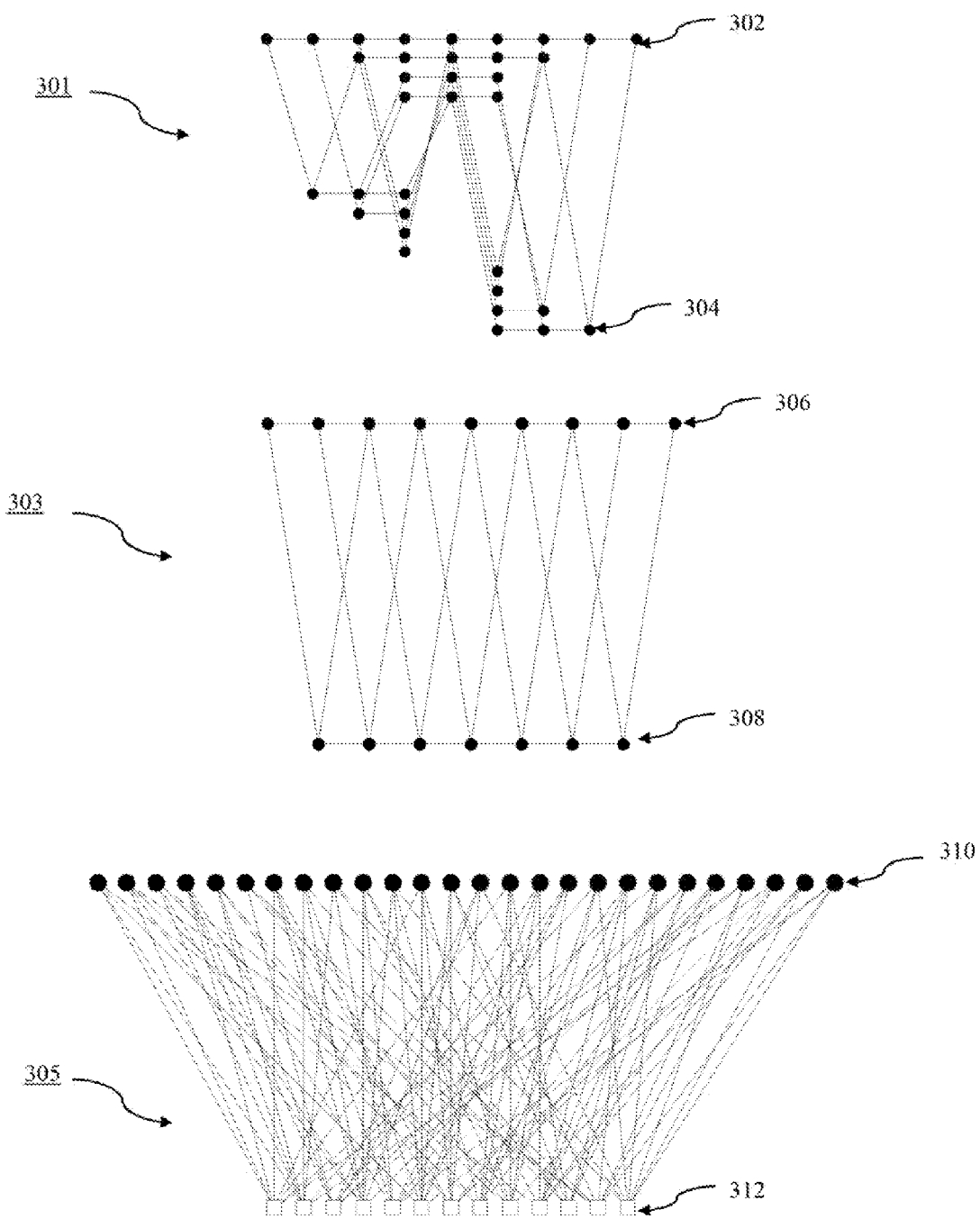
FIG. 3 is a flow diagram illustrating a system/method for data transport generalized low-density parity-check (GLDPC) codes derived from multiple component codes in accordance with the present principles.

Referring now to FIG. 3, plots of graph descriptions for data transport employing multiple component code based generalized low-density parity-check (GLDPC) codes to improve error correction (e.g., forward error correction (FEC)) is illustratively depicted according to one embodiment of the present principles. In one embodiment, as an illustration, a GLDPC code composed of, for example, RM(1,3) and single-parity checks is shown. Component (local codes) may be based on RM(1,3), designated by trellis description 301, and single-parity RM(2,3) codes, designated by trellis description 303, while the global code may be based on a bipartite (e.g., Tanner) graph of girth-10, column-weight-3, QC-LDPC (3544,2215) code (with permutation block size of 443), designated by 305. In one embodiment, point 310 may represent the bit node in a global code and square 312 the component code.

In one embodiment, if the every 100-th row in global code is replaced by RM(1,3) code, the corresponding GDLPC code may be of rate 0.614. The upper bound of this two-component-RM-codes-based-GLDPC code may be 0.625. Decoding of component RM(1,3) and RM(2,3) codes may be based on the fast Hadamard-Walsh transform (FHWT). The bit log-likelihood ratios may then be passed to the global code, which may apply a variable-node update rule.

The overall decoding method of GLDPC code is similar to the sum-product algorithm in which the check-nodes update rule get replaced by decoding of local codes. When every 100-th component code is based on RM(1,3), the complexity of GLDPC decoding is in order of $(2176/100) \times 8 \log_2 8$ operations per sub-node (where the decoding complexity of parity-check code is trivial, and may be ignored).

A conventional LDPC code may have the girth-8 and column-weight-5, row-weight-13, with the complexity of check-node update rule being $(7241-4456) \times 13$, for example. Therefore, the overall complexity of GLDPC code from this embodiment according to the present principles is approximately 70 times lower than that of conventional LDPC codes. It is noted that this example has been provided for illustrative purposes, and that other configurations of rows, rates, etc. may also be employed according to the present principles.

It is noted that the present principles may be employed to improve overall BER performance of LDPC codes, by employing the GLDPC codes with multiple component (local) codes. These component local codes are taken from, for example, the following classes of codes, to enable low decoding complexity of GLDPC codes: Hamming, BCH and RM codes as well as corresponding codes derived from these codes (various extended, shortened versions, etc.). To solve for low code rate problem, a class of GLPDC codes employed according to one embodiment may be composed of single-parity checks and several local block codes.

Since the MAP decoding of a single-parity check is trivial, while the overall complexity of MAP decoder for RM code, based on FWHT is of order n log n, this class of GLPDC codes according to the present principles enables ultra-high-speed implementation, as the decoding complexity is much lower compared to LDPC counterparts.

In one embodiment, record coding gains have been shown by employing GLDPC codes derived from multiple component codes according to the present principles. For example, the GLDPC (59993, 49397, 0.823) may have the NCG of 12 dB at BER of $10^{-15}$, representing the largest ever reported NCG for 21.45% overhead code. We have shown that the proposed class of GLDPC codes, composed of multiple local codes and single-parity checks, enables almost continuous tuning of code rate. Therefore, the proposed class of GLDPC coding is extremely suitable for rate adaptive coding as well as adaptive modulation and coding.

Figure 4:
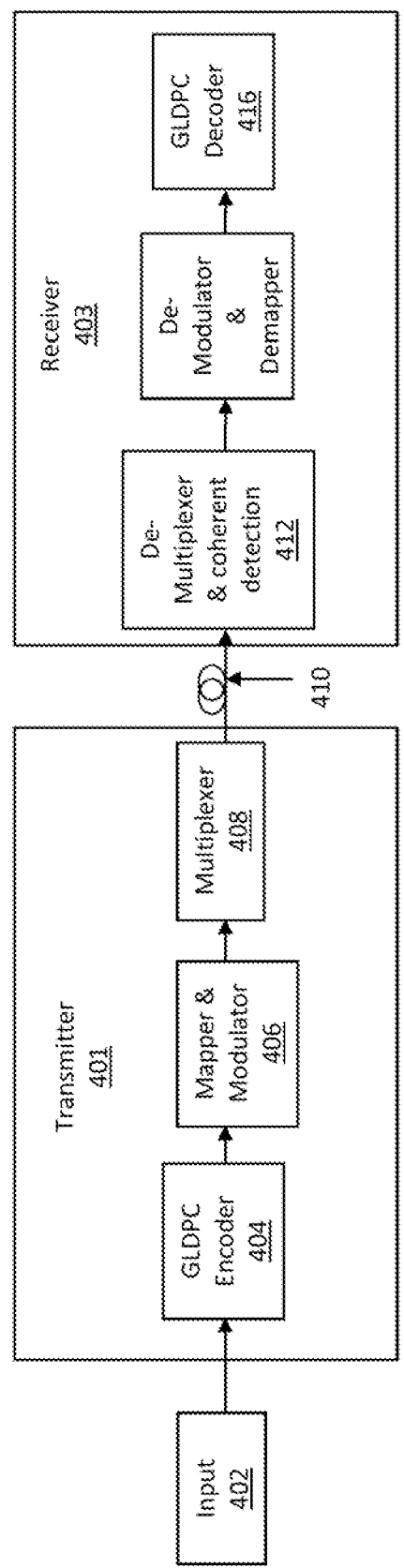
FIG. 4 is a block/flow diagram illustrating a system for data transport that employs generalized low-density parity-check (GLDPC) codes derived from multiple component codes in accordance with the present principles.

Referring now to FIG. 4, a high level illustration of a system for data transport employing multiple component code based generalized low-density parity-check (GLDPC) codes 100 to improve error correction (e.g., forward error correction (FEC)) is illustratively depicted according to one embodiment of the present principles. In one embodiment, input data 402 may be received into a transmitter 401, and may be encoded using one or more GLDPC encoders in block 404. The data may be mapped to a given constellation and modulated in block 406 using a mapper followed by electro-optical modulator, and may be multiplexed using either polarization division multiplexer or mode-multiplexer in block 408. The optically multiplexed signals may be transmitted over a transmission medium 410 (e.g., SMF or FMF). The transmitted signals may be received by a receiver 403, and the signals may be demultiplexed using a modede-multiplexer followed by polarization diversity coherent detector in block 412, demodulated and demapped using a demodulator & demapper in block 414. The signals demodulation by an a posteriori probability demodulator/demapper in block 414, and may then be decoded using one or more GLDPC decoders in block 416. The decoding may continue until a valid codeword has been obtained or a predetermined (e.g., maximum) number of iterations has been reached.

It is noted that although the above configuration is illustratively depicted according to the present principles, other sorts of configurations may also be employed according to the present principles.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. Additional information is provided in an appendix to the application entitled, "Additional Information". It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A method for data transport, comprising:
   encoding one or more streams of input data using one or more generalized low-density parity check (GLDPC) encoders, the one or more GLDPC encoders being configured to:
   generate GLDPC coded streams by concurrently using two or more
   types of component local codes to increase error correction strength, the plurality of types of component local codes including at least two of Hamming; Bose, Chaudhuri, and Hocquenghem (BCH); or Reed-Muller (RM) codes;
   employ single-parity checks and two or more local block codes during generation of the GLDPC coded streams; and
   enable continuous tuning of code rate using the generated GLDPC coded streams;
   generating one or more signals from the GLDPC coded streams using one or more mappers, the mappers configured to assign bits of the one or more signals from the GLDPC coded streams to one or more signal constellations and to associate the bits of the one or more signals with one or more signal constellation points;
   modulating the signal from the mappers using either In-phase/Quadrature (I/Q) or 4-Dimensional (4D) modulators composed of one polarization beam splitter, two I/Q modulators, and one polarization beam combiner;
   multiplexing modulated signals by using one or more mode-multiplexers; and
   transmitting the modulated multiplexed signals over a transmission medium.

2. The method as recited in claim 1, wherein the GLDPC coded streams are employed for rate adaptive coding.

3. The method as recited in claim 1, wherein the GLDPC coded streams are employed for adaptive modulation and coding.

4. The method as recited in claim 1, wherein the GLDPC coded streams are employed in multilevel and multidimensional coded-modulations.

5. The method as recited in claim 1, wherein the GLDPC coded streams employ one or more global LDPC codes, the global LDPC codes being based on either regular or irregular LDPC codes.

6. The method as recited in claim 5, wherein an i-th row of the global LDPC codes is replaced by a parity check matrix of an i-th local code.

7. The method as recited in claim 1, further comprising:
   receiving the transmitted signals using one or more receivers;
   demultiplexing followed by polarization diversity coherent detection of the received signals and demodulating/demapping using one or more demultiplexers, one or more coherent detectors, and one or more demodulators/demappers;
   decoding the demodulated/demapped signals using one or more GLDPC decoders, the one or more GLDPC decoders being configured to perform a plurality of iterations of decoding; and
   halting decoding when a valid codeword has been obtained or a predetermined number of iterations is reached.

8. The method as recited in claim 7, wherein the plurality of iterations of decoding is performed using a subnode update rule and a specialized low-complexity Ashikhmin-Lytsin decoder, wherein the Ashikhmin-Lytsin decoder operates on local codes described by parity check matrices.

9. A system for transmitting data, comprising:
   one or more generalized low-density parity check (GLDPC) encoders configured to encode one or more streams of input data, the one or more GLDPC encoders being further configured to:
   generate GLDPC coded streams by concurrently using two or more
   types of component local codes to increase error correction strength, the plurality of types of component local codes including at least two of Hamming; Bose, Chaudhuri, and Hocquenghem (BCH); or Reed-Muller (RM) codes;
   employ single-parity checks and two or more local block codes during generation of the GLDPC coded streams; and
   enable continuous tuning of code rate using the generated GLDPC coded streams;
   one or more mappers configured to generate one or more signals from the GLDPC coded streams, the mappers being further configured to assign bits of the one or more signals from the GLDPC coded streams to one or more signal constellations and to associate the bits of the one or more signals with one or more signal constellation points;
   one or more In-phase/Quadrature (I/Q) or 4-Dimensional (4D) modulators configured to modulate the one or more signals from the one or more mappers using either one polarization beam splitter, two I/Q modulators, or one polarization beam combiner;
   one or more mode-multiplexers configured to multiplex modulated signals; and
   a transmission medium configured to transmit the modulated multiplexed signals.

10. The system as recited in claim 9, wherein the GLDPC coded streams are employed for rate adaptive coding.

11. The system as recited in claim 9, wherein the GLDPC coded streams are employed for adaptive modulation and coding.

12. The system as recited in claim 9, wherein the GLDPC coded streams are employed in multilevel and multidimensional coded-modulations.

13. The system as recited in claim 9, wherein the GLDPC coded streams employ one or more global LDPC codes, the one or more global LDPC codes being based on either regular or irregular LDPC codes.

14. The system as recited in claim 13, wherein an i-th row of the one or more global LDPC codes is replaced by a parity check matrix of an i-th local code.

15. A system for receiving data, comprising:
one or more receivers configured to receive transmitted modulated multiplexed signals;
one or more demultiplexers, one or more coherent detectors, and one or more demodulators/demappers configured to: demultiplex, perform polarization diversity coherent detection of the received transmitted modulated multiplexed signals, and demodulate/demap the received transmitted modulated multiplexed signals, respectively; and
one or more generalized low-density parity-check (GLDPC) decoders configured to decode the demodulated/demapped signals from GLDPC coded streams generated by concurrently using two of more types of component local codes, the one or more GLDPC decoders being further configured to perform a plurality of iterations of decoding, and to halt decoding when a valid codeword has been obtained or a predetermined number of iterations is reached, the plurality of types of component local codes including at least two of Hamming; Bose, Chaudhuri, and Hocquenghem (BCH); or Reed-Muller (RM) codes.

16. The system as recited in claim 15, wherein the plurality of iterations of decoding is performed using a subnode update rule and a specialized low-complexity Ashikhmin-Lytsin decoder, wherein the specialized low-complexity Ashikhmin-Lytsin decoder operates on local codes described by parity check matrices.

17. The system as recited in claim 15, wherein the one or more GLDPC decoders are employed for rate adaptive coding.

18. The system as recited in claim 15, wherein the one or more GLDPC decoders are employed in multilevel and multidimensional coded-modulations.

* * * * *